United States Patent
Procházka

(10) Patent No.: US 10,873,320 B2
(45) Date of Patent: Dec. 22, 2020

(54) METHODS AND APPARATUS FOR REDUCING FILTER DELAY

(71) Applicant: Allegro MicroSystems, LLC, Manchester, NH (US)

(72) Inventor: Roman Procházka, Struharov (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 60 days.

(21) Appl. No.: 16/395,787

(22) Filed: Apr. 26, 2019

(65) Prior Publication Data
US 2020/0343879 A1  Oct. 29, 2020

(51) Int. Cl.
| H03H 11/04 | (2006.01) |
| H03H 19/00 | (2006.01) |
| G01R 33/00 | (2006.01) |
| G01R 33/02 | (2006.01) |

(52) U.S. Cl.
CPC ......... *H03H 11/04* (2013.01); *G01R 33/0029* (2013.01); *G01R 33/02* (2013.01); *H03H 19/004* (2013.01); *H03H 2011/0488* (2013.01)

(58) Field of Classification Search
None
See application file for complete search history.

(56) References Cited

U.S. PATENT DOCUMENTS

| 5,331,218 | A | 7/1994 | Moody et al. |
| 5,451,852 | A * | 9/1995 | Gusakov ............... H03H 11/12 318/611 |
| 7,425,821 | B2 | 9/2008 | Monreal et al. |
| 7,990,209 | B2 | 8/2011 | Romero |
| 8,416,014 | B2 | 4/2013 | Romero |
| 8,680,846 | B2 | 3/2014 | Cesaretti et al. |
| 9,214,973 | B1 * | 12/2015 | Venkatesh ............ H04B 1/1036 |
| 9,817,083 | B2 | 11/2017 | Romero |
| 10,270,428 | B1 | 4/2019 | Geisler et al. |
| 2006/0181284 | A1 * | 8/2006 | Fraedrich ............. G01R 31/083 324/543 |
| 2011/0221518 | A1 * | 9/2011 | Romero ............... H03H 19/004 327/554 |
| 2019/0079143 | A1 | 3/2019 | Romero et al. |

OTHER PUBLICATIONS

U.S. Appl. No. 16/372,603, filed Apr. 2, 2019, Romero et al.

* cited by examiner

*Primary Examiner* — Jas A Sanghera
(74) *Attorney, Agent, or Firm* — Daly, Crowley, Mofford & Durkee, LLP

(57) ABSTRACT

A filter circuit includes a filter having an input and an output at which an output of the filter is provided, a step detector coupled to receive an input signal at the input of the filter and configured to detect a predetermined step in the input signal and to assert a bypass signal in response to detection of the predetermined step. A logic circuit is responsive to the bypass signal and configured to cause the input signal to be coupled to the output of the filter without filtering when the bypass signal is asserted.

23 Claims, 7 Drawing Sheets

METHODS AND APPARATUS FOR REDUCING FILTER DELAY

CROSS-REFERENCE TO RELATED APPLICATIONS

Not Applicable.

STATEMENT REGARDING FEDERALLY SPONSORED RESEARCH

Not Applicable.

FIELD

This disclosure relates generally to filter circuits, and, more particularly, to methods and apparatus for dynamically reducing filter delay.

BACKGROUND

As is known, in many electronic circuits, response time and bandwidth are critical parameters. Filters are often necessary for various application specific reasons, but the use of filters can increase a circuit's overall response time and therefore reduce the bandwidth.

One example circuit type that often includes a filter to reduce undesirable spectral components is magnetic field sensors. Magnetic field sensors are used in a variety of applications and in general include one or more magnetic field sensing elements, such as a Hall Effect element, to detect a magnetic field.

It is known that Hall Effect elements exhibit an undesirable DC offset voltage. Techniques have been developed to reduce the DC offset voltage, while still allowing the Hall Effect element to sense a DC magnetic field. One such technique is commonly referred to as "current spinning." Current spinning is a technique by which a Hall Effect element is driven in two or more different current directions, and outputs are received at different output terminals as the Hall Effect element is differently driven. With current spinning, offset voltages of the different driving arrangements tend to cancel toward zero.

Chopping (also called square wave modulation) is a technique that alternates between a signal and an inverted signal. Chopping is sometimes applied to amplifiers to reduce an offset component and low frequency noise (i.e., flicker noise) of signals applied to the amplifier. Amplifiers implementing chopping are often referred to as chopper stabilized amplifiers.

The current spinning tends to generate undesirable spectral components (i.e., frequency components in the frequency domain). Similarly, chopper stabilized amplifiers can also generate undesirable spectral components. The undesirable spectral components can be removed with filters. Circuits that current spin a Hall element, chop and amplify the current spun Hall element signal, and that use one or more filters to remove undesirable spectral components are described in U.S. Pat. No. 8,680,846, filed on Apr. 27, 2011, entitled "Circuits and Methods for Self-Calibrating or Self-Testing a Magnetic Field Sensor," assigned to the assignee of the present invention, and which is incorporated by reference herein in its entirety.

While conventional filter arrangements can effectively reduce undesirable spectral components, filters tend to reduce a bandwidth or a response time of the magnetic field sensors and other circuit types that use filters.

SUMMARY

The present disclosure provides a filter circuit and associated methods capable of reducing filter throughput delay associated with input signals of a predetermined step size. The manner of reducing the response time is to dynamically bypass the filter when a large input signal step is detected.

In one aspect, a filter circuit includes a filter having an input and an output, a step detector coupled to receive an input signal at the input of the filter and configured to detect a predetermined step in the input signal and to assert a bypass signal in response to detection of the predetermined step, and a logic circuit responsive to the bypass signal and configured to cause the input signal to be coupled to the output of the filter without filtering when the bypass signal is asserted.

The filter circuit may include one or more of the following features separately or in combination. The filter may include an amplifier having at least one input and an output at which the output of the filter is provided and a sampling capacitor selectively coupled to (a) the input of the filter through a first switch, (b) the at least one input of the amplifier through a second switch, or (c) to both the input of the filter through the first switch and to the at least one input of the amplifier through the second switch. The logic circuit can be configured to cause the sampling capacitor to be coupled to both the input of the filter through the first switch and to the at least one input of the amplifier when the bypass signal is asserted. The predetermined step in the input signal can be detected when a change in the input signal is greater than a predetermined threshold. In some embodiments, the step detector includes a comparator having a first input coupled to receive the input signal, a second input coupled to receive the predetermined threshold, and an output at which the bypass signal is provided based on evaluation of a derivative of the input signal. In some embodiments, the step detector includes a comparator having a first input coupled to receive an offset version of the input signal that differs from the input signal by an offset amount, a second input coupled to receive the output of the filter, and an output at which the bypass signal is provided, wherein the offset amount corresponds to the predetermined threshold.

The sampling capacitor may include a plurality of parallel coupled sampling capacitors, each selectively coupled to (a) the input of the filter through a respective first switch, (b) the at least one input of the amplifier through a respective second switch, or (c) to both the input of the filter through the respective first switch and to the at least one input of the amplifier through the respective second switch. In embodiments, the amplifier has at least two inputs, the input signal is a differential input signal, and the amplifier comprises two inputs coupled to receive the differential input signal. The filter can be an analog or a digital filter also, can be a notch filter.

In another aspect, a magnetic field sensor includes one or more magnetic field sensing elements configured to generate a magnetic field signal in response to a magnetic field, a front end amplifier coupled to the one or more magnetic field sensing elements and configured to amplify the magnetic field signal to generate a front end output signal, a filter circuit, and an output circuit. The filter circuit can include a filter having an input coupled to receive the front end output signal and an output at which a filter output signal is provided, a step detector coupled to receive the front end output signal and configured to detect a predetermined step in the input signal and to assert a bypass signal in response to detection of the predetermined step, and a logic circuit responsive to the bypass signal and configured to cause the front end output signal to be coupled to the output of the filter without filtering when the bypass signal is asserted. The output circuit can be coupled to receive the filter output signal and have an output at which the sensor output signal is provided in response to the filter output signal.

The magnetic field sensor may include one or more of the following features separately or in combination. The filter may include an amplifier having at least one input and an output at which the filter output signal is provided and a sampling capacitor selectively coupled to (a) the input of the filter through a first switch, (b) the at least one input of the amplifier through a second switch, or (c) to both the input of the filter through the first switch and to the at least one input of the amplifier through the second switch.

The logic circuit can be configured to cause the sampling capacitor to be coupled to both the input of the filter through the first switch and to the at least one input of the amplifier when the bypass signal is asserted. The front end amplifier can be a chopped amplifier operating a chopping frequency and wherein the filter has a notch selected to attenuate signal components at the chopping frequency. The output circuit can include a fault detector configured to generate a fault signal in response to detection of a fault.

According to a further aspect, a method including receiving an input signal at an input of a filter, monitoring the input signal to detect a predetermined step change, and selectively filtering, by the filter, the input signal to generate a filter output signal when the predetermined step change in the input signal is not detected or bypassing the filter when the predetermined step change in the input signal is detected.

Features of the method may include one or more of the following. Filtering the input signal to generate a filtered output signal may include selectively coupling at least one sampling capacitor either to the input of the filter through a first switch or to an input of an amplifier through a second switch. Bypassing the filter may include charging the at least one sampling capacitor to a level of the input signal. In some embodiments, monitoring the input signal may include comparing the input signal to a predetermined threshold. In some embodiments, monitoring the input signal includes comparing the filter output signal to an offset version of the input signal.

Also described is apparatus including a filter having an input and an output at which an output of the filter is provided, means, coupled to receive an input signal at the input of the filter, for detecting a predetermined step in the input signal and to assert a bypass signal in response to detection of the predetermined step, and means, responsive to the bypass signal, for coupling the input signal to the output of the filter when the bypass signal is asserted.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

The features and other details of the disclosure will now be more particularly described. It will be understood that any specific embodiments described herein are shown by way of illustration and not as limitations of the concepts, systems and techniques described herein. The principal features of this disclosure can be employed in various embodiments without departing from the scope of the concepts sought to be protected.

Figure 1:
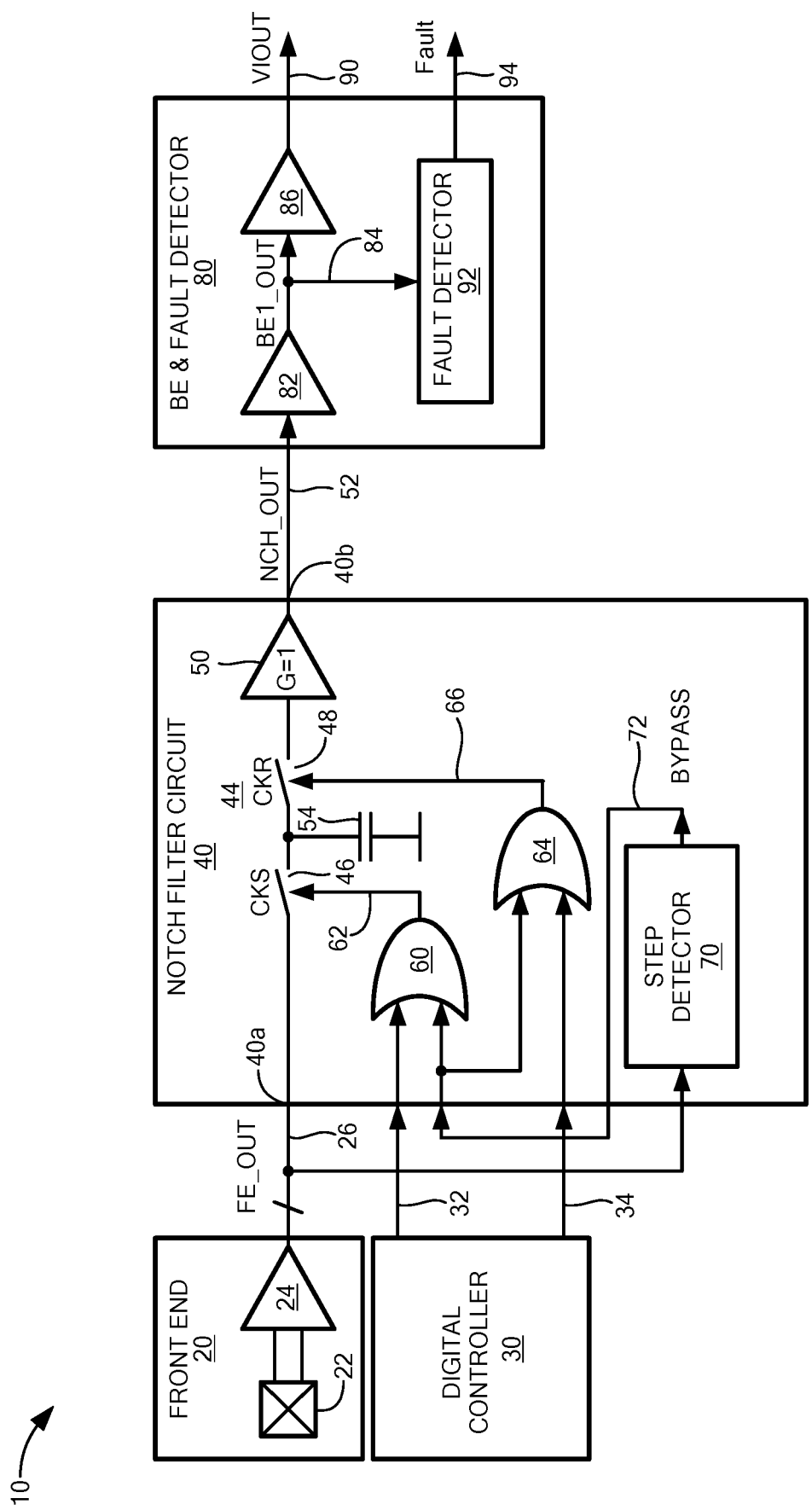
FIG. 1 is a functional block diagram of an example magnetic field sensor having notch filter with a dynamic bypass feature according to the disclosure.

Referring to FIG. 1, a magnetic field sensor 10 includes one or more magnetic field sensing elements 22 configured to generate a magnetic field signal in response to a magnetic field, a front end amplifier 24 coupled to the sensing element(s) 22 and configured to amplify the magnetic field signal to generate a front end output signal FE_OUT 26, and a filter circuit 40 having an input 40a coupled to the analog front end 20 and an output 40b at which an output of the filter is provided.

According to the disclosure, filter circuit 40 includes a filter 44, a step detector 70 coupled to receive the front end output signal FE_OUT 26 as an input signal at the input 40a of the filter and configured to detect a predetermined step in the input signal and to assert a bypass signal 72 in response to detection of the predetermined step, and a logic circuit 60, 64 responsive to the bypass signal and configured to cause the filter input signal 26 to be coupled to the output 40b of the filter without filtering when the bypass signal is asserted.

With this arrangement, filter 44 is configured to selectively filter the input signal 26 to generate a filter output signal NCH_OUT 52 when the predetermined step in the input signal is not detected or to bypass the filter when the predetermined step in the input signal is detected. Bypassing the filter 44 in the presence of a large step input signal decreases the signal path response time by minimizing throughput delay for large step input signals.

The magnetic field sensor 10 may take various forms, such as a current sensor configured to sense a current in a conductor (not shown). As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The magnetic field sensing element(s) 22 can generate a signal proportional to the sensed magnetic field for coupling to a front end amplifier 24. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Figure 2:
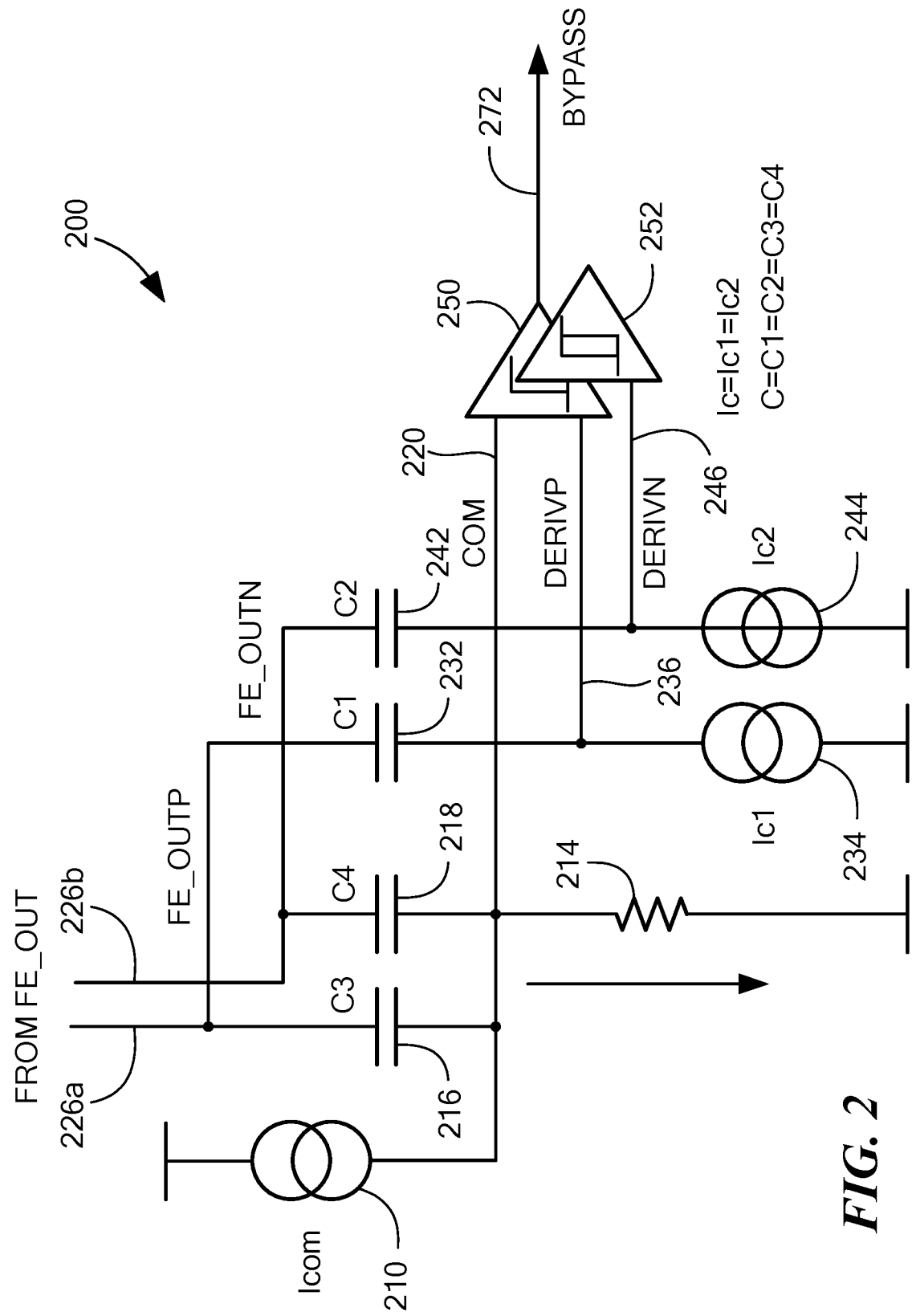
FIG. 2 is an example step detector of the notch filter of FIG. 1.

In embodiments, the magnetic field sensing element(s) 22 can implement current spinning and/or the front end amplifier 24 can be a chopper stabilized amplifier. The front end amplifier 24 output signal FE_OUT 26 can thus contain undesirable spectral components to be filtered by filter 44. It will be appreciated that the front end output signal FE_OUT 26 can comprise more than one signal. For example, the front end output signal 26 can be a differential output signal as shown in FIG. 2.

Filter 44 can take various forms. In the example of FIG. 1, the filter 44 is a notch, or band stop filter and in particular, a switched capacitor notch filter. Other types of notch filter implementations (e.g., a digital implementations) and other filter types of both analog and/or digital implementation, such as a low pass filter, a high pass filter, a bandpass filter, etc. are possible.

Filter 44 is shown in a simplified fashion in FIG. 1 as including a first switch 46, a capacitor 54, a second switch 48, and a gain element 50. A more detailed example filter is shown and described below in connection with FIG. 4. When filter 44 is configured to filter input signal 26, during a first phase of a clock signal, switch 46 is closed in order to thereby charge the capacitor 54 to the level of the filter input signal 26 and switch 48 is open to decouple the capacitor 54 from filter output 40b. During a second phase of the clock signal (that does not overlap with the first phase), switch 46 is open and switch 48 is closed in order to thereby decouple the capacitor 54 from the input signal 26 and couple the capacitor to filter output 40b. With this switch configuration during the second clock phase, charge on the capacitor 54 is transferred to the filter output 40b. Also during the second clock phase, in embodiments including multiple parallel coupled sampling capacitors (e.g., on capacitors 456 in FIG. 4), charge on the sampling capacitors can be averaged.

Filter gain element 50 can introduce a unity gain or other gain based on application related considerations. The gain element 50 can be implemented by various circuitry, including but not limited to an emitter follower, an operational amplifier, or other elements configured to introduce gain in the signal path.

Switches 46, 48 are controlled by respective control signals 32, 34, respectively, as may be generated by a controller, or processor, such as digital controller 30. As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

More particularly, control signals 32, 34 are processed by the logic circuit 60, 64 in order to generate respective switch control signals CKS 62, CKR 66, as will be explained. Suffice it to say here that when the filter 44 is configured to filter input signal 26, the switch control signals CKS 62, CKR 66 cause the switches 46, 48 to operate in the above-described, complementary manner in which switch 46 is closed (i.e., the filter 44 is in a "sample phase") during the first clock phase and then switch 48 is closed (i.e., the filter is in a "redistribution phase") during the second clock phase and at no time are both switches closed simultaneously (i.e., switch control signals CKS 62, CKR 66 are non-overlapping complementary signals). According to the disclosure, under certain operating conditions (i.e., when the predetermined step is detected on the input signal 26), the filter is no longer configured to filter the input signal, but rather is "bypassed."

Filter 44 introduces an inherent processing delay in the signal path, which delay can be significant when the filter input signal 26 has a large step. Ideally the throughput delay (td) of the filter 44 is related to the sampling frequency (e.g., td=1/f1, where f1 is the frequency of the first notch). However, when a large input step is detected, the delay is defined by switches 46, 48 and the bandwidth of amplifier 50. The processing delay can adversely affect sensor fault response time and output signal response time.

Figure 3:
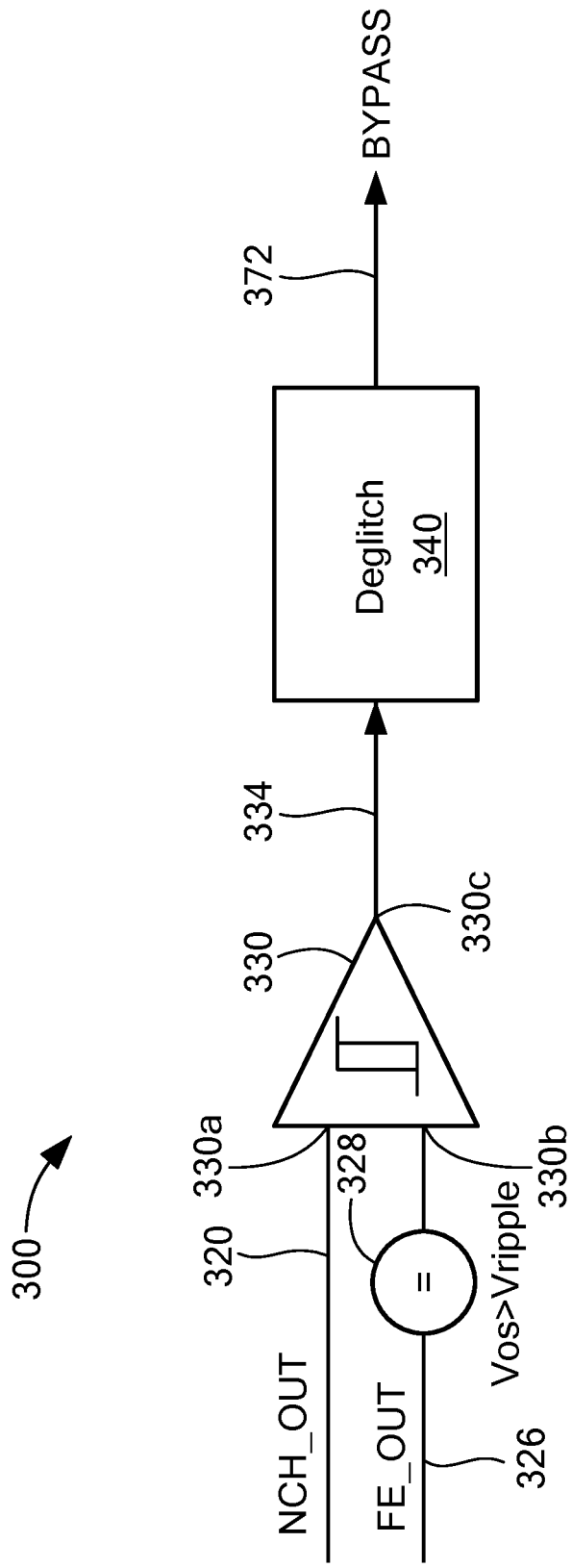
FIG. 3 is an alternative example step detector of the notch filter of FIG. 1.

Step detector 70 is coupled to receive filter input signal 26 at the input 40a of the filter and configured to detect a predetermined step in the input signal. Various circuitry and techniques can be used to detect the predetermined step in the input signal 26, as is shown in the examples of FIGS. 2 and 3. Furthermore, parameters of the predetermined step (e.g., magnitude and/or slew rate depending on the detector embodiment) can be preset, programmable, or otherwise adjustable. Suffice it to say here that when the predetermined step is detected, the detector 70 asserts the bypass signal 72.

Logic circuit 60, 64 is responsive to the bypass signal 72 and configured to cause the filter input signal 26 to be coupled to the output 40b of the filter without filtering when the bypass signal is asserted. More particularly, the example logic circuit includes OR gates 60, 64 each of which is coupled to receive the bypass signal 72 and a respective control signal 32, 34. When bypass signal 72 is asserted (e.g., at a logic high level due to detection of the predetermined step in the input signal 26), the logic gates 60, 64 both provide logic high output signals CKR 62, CKS 66, thereby causing both switches 46, 48 to be closed, thereby bypassing the filter 44 by coupling the filter input 40a to the filter output 40b without filtering (i.e., coupling the filter input 40a directly to the gain element 50) and quickly charging the capacitor 54 to the level of the input signal 26.

When the bypass signal 72 is not asserted, or is disabled (e.g., at a logic low level due to no detection of the predetermined step in the input signal 26), gates 60, 64 allow the respective control signal 32, 34 to pass through to the logic gate output to provide the respective switch control signal 62, 66. When the bypass signal is disabled after having been asserted, the filter continues its normal operation of averaging the input signal 26 starting from the newly settled value reached during assertion of the bypass signal.

With this arrangement, the active (i.e., asserted) state of the bypass signal 72 causes the filter 44 to be bypassed (i.e., as if the filter 44 were not present), thereby eliminating any throughput delay otherwise caused by the filter 44. Whereas, the inactive (i.e., not asserted) state of the bypass signal 72 operates to permit filtering by filter 44 in the normal manner (e.g., as if the step detector 70 and logic circuit 60, 64 were not present).

The magnetic field sensor 10 can further include a back end and fault detector circuit 80 coupled to receive the filter output signal NCH_OUT 52. The circuit 80 can include cascaded gain elements 82, 86 configured to generate a sensor output signal 90. The information indicated by the sensor output signal 90 depends on the sensor type. For example, in embodiments in which the sensor 10 is a current sensor, sensor output signal 90 can be a signal having a level indicative of a current through a current carrying conductor as sensed by the magnetic field sensing element(s) 22 of the sensor 10. The sensor output signal 90 may take various forms, including but not limited to a SPI format, a SENT format, or an I²C format, for communication of the sensed current to external circuits and systems.

The fault detector 92 is coupled to receive a signal BE1_OUT 84 from gain element 82 and is configured to detect a fault and generate a fault output signal 94, as shown. The fault signal 94 can take various forms, depending on the sensor type and fault detection type. For example, in a current sensor embodiment, the fault output signal 94 can be indicative of an overcurrent or undercurrent fault condition. It will be appreciated that the bandwidth of the signal processing path is significant in the ability of the fault detector 92 to respond quickly to fault conditions as can be critical for safe sensor operation.

It will be appreciated that while the filter circuit 40 is shown in FIG. 1 in the application of a magnetic field sensor 10, the filter circuit provides the same or similar advantages in other types of applications. In general, the filter circuit is useful in any circuit or system in which it is desired to reduce filter throughput delay under large input signal step conditions.

While the magnetic field sensor 10 may be provided in the illustrated form of an integrated circuit with an analog front end portion and a digital portion, it will be appreciated that the particular delineation of which circuit functions are implemented in an analog fashion or with digital circuitry and signals can be varied. Further, some of the illustrated circuit functions can be implemented on an integrated circuit sensor 10 and other circuitry and functionality can be implemented on separate circuits (e.g., additional substrates within the same integrated circuit package, or additional integrated circuit packages, and/or on circuit boards).

Referring also to FIG. 2, an example step detector 200 (as may provide the step detector 70 of FIG. 1) is coupled to receive differential front end output signal FE_OUTP 226a, FE_OUTA 226b (which likewise provide filter input signals and which may be the same as or similar to front end output signal 26 of FIG. 1). Step detector 200 includes a comparator, here two comparators 250, 252, each responsive to a respective front end output signal FE_OUTP 226a, FE_OUTN 226b and to a threshold signal COM 220. Although shown as two separate single-ended comparators 250, 252, alternatively, a double differential comparator could be used. Comparator output signal 272 provides the bypass signal that may be the same as or similar to bypass signal 72 of FIG. 1 and can be provided as a logical OR of the output signals from comparators 250 and 252.

More particularly, comparator 250 has a first input coupled to the FE_OUTP 226a signal through capacitor C1 232 and further coupled to current sink 234, which capacitor 232 and current sink 234 operate to establish a signal DERIVP 236 that is indicative of a change in voltage of the input signal FE_OUTP 226a (i.e., indicative of a derivative or slope of the input signal). With this configuration, comparator 250 detects a positive signal step. Comparator 252 has a first input coupled to the FE_OUTN signal 226b through capacitor C2 242 and further coupled to current sink 244, which capacitor 242 and current sink 244 operate to establish a signal DERIVN 246 indicative of a change in voltage of the input signal FE_OUTN 226b (i.e., indicative of a derivative or slope of the input signal). With this configuration, comparator 252 detects a negative signal step. A second input of comparator 250 and a second input of comparator 252 are coupled to threshold voltage COM 220. It will be appreciated that the selection of elements and sizes (e.g., capacitance of capacitors 232, 242, and current sinks 234, 244) affect the slew rate of the monitored signals 236, 246 and can be adjusted to suit a particular application.

The threshold signal COM 220 is established by a current source 210 having a current value Icom and a resistor 214, which elements are sized to set the threshold signal 220 at a level corresponding to a desired predetermined input signal step size to be detected. Thus, the level of the threshold signal 220 can be given by (Icom)(resistance of resistor 214).

Bypass signal 272 provided at the outputs of comparators 250, 252 can be the same as or similar to bypass signal 72 (FIG. 1). With the arrangement of step detector 200, when either comparator input signal 236, 246 exceeds the threshold signal level 220, the output of the respective comparator 250, 252 toggles (e.g., transitions to a high level) in order to thereby assert the bypass signal 272 based on evaluation of a derivative of the input signal. Stated differently, the bypass signal 272 is asserted when the following equation is valid:

$$dV_{FE\_OUTx} > \frac{I_c}{Cx} dt + (I_{com})(R214)$$

where $V_{FE\_OUTx}$ is the voltage of one of the differential input signals 226a, 226b, Ic is the current of the respective current sink 234, 244, Cx is the capacitance of the respective capacitor 232, 242, Icom is the current of source 210, and R214 is the resistance of resistor 214. In this way, step detector 200 detects a large step on the input signal (both on positive input signal 226a and on negative input signal 226b). When the detected input signal step is large enough and fast enough to exceed the threshold 220, the bypass signal 272 is asserted. As one example, the threshold signal 220 can have a level on the order of 100 mV based on an Icom level of 8 μA and a resistor 214 of 12.5 kohms, the capacitor Cx can have a value of 2 pF and the current Ic can have a value of 500 nA. With these example values, it will be apparent that a signal step with a nearly zero slew rate and with a differential level (i.e., VFE_OUTP-VFE_OUTN) of greater than 200 mV or less than −200 mV will cause the bypass signal to be asserted. It will also be apparent that as the slew rate increases, the magnitude of the input signal step necessary to cause the bypass signal to be asserted increases.

Optional capacitive coupling between the COM node 220 and the FE_OUTP and FE_OUTN signals 226a, 226b can be implemented by capacitors C3 216 and C4 218, as shown, in order to compensate for effects of, or reject, common mode voltage variations and/or noise.

Referring to FIG. 3, another example step detector 300 (as may provide the step detector 70 of FIG. 1) is coupled to front end output signal FE_OUT 326 (which likewise provides the filter input signal, and which may be the same as or similar to front end output signal 26 of FIG. 1). Although shown as a single-ended signal FE_OUT 326 for simplicity of illustration, it will be appreciated that the front end output signal 326 may be a differential signal (e.g., including FE_OUTN, FE_OUTP as in FIG. 2) in which case the comparator 330 can be implemented as a double differential comparator.

Step detector 300 includes a comparator 330 having a first input 330a responsive to the filter output signal NCH_OUT 320 (e.g., signal 52 of FIG. 1), a second input 330b responsive to a threshold signal (provided as an offset version of the front end output signal FE_OUT 326), and an output 330c at which a comparator output signal 334 is provided. The offset amount introduced by offset element 328 can be selected to establish a desired predetermined input signal step size to be detected. By comparing the filter output signal NCH_OUT 320 to the offset version of the filter input signal 326, it can be determined whether the input signal 326 contains a step size greater than the predetermined step. Stated differently, when the input signal FE_OUT 326 differs from the filter output signal NCH_OUT 320 by more than the offset amount 328, the bypass signal 372 is asserted. Thus, the offset amount of offset element 328 defines the threshold at which the step detector 300 starts to detect large signal step.

An optional deglitch circuit 340 can be coupled to receive the comparator output signal 334 and may be beneficial to avoid very short comparator output signal pulses that can occur when the bypass signal 372 is asserted (i.e., when the NCH_OUT signal 320 is substantially identical to the FE_OUT signal 326). Various schemes are possible for implementing deglitching. As non-limiting examples, deglitching can be applied symmetrically on both the rising and falling edges of the bypass signal, non-symmetrically so as to add more delay on the rising edges, or non-symmetrically so as to add more delay on the falling edges. It will be appreciated that deglitch functionality and circuitry can be applied to the step detector 72 of FIG. 1 and to the step detector 200 of FIG. 2.

Figure 4:
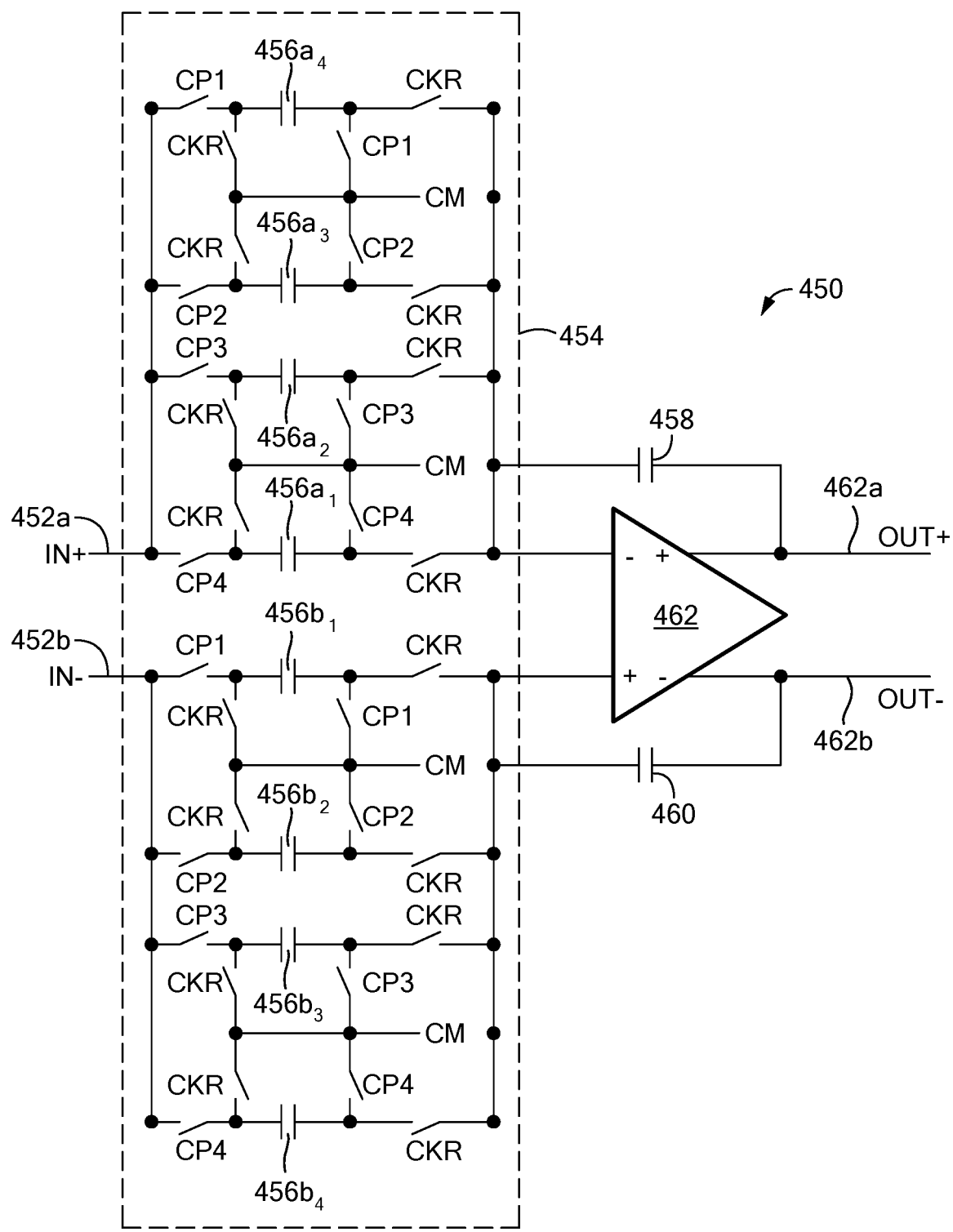
FIG. 4 is an example differential switched capacitor notch filter.

Referring to FIG. 4, a more detailed example filter (as may be used as the filter 44 of FIG. 1) is shown in the form of a four-phase switched capacitor notch filter integrator 450. More generally however, the switched capacitor notch filter integrator 450 can be representative of an N-phase switch capacitor notch filter integrator, here shown for the case of 4× chopping, where N=4.

The switched capacitor notch filter integrator 450 is coupled to receive a differential input signal 452a, 452b, which signal may be the same as or similar to differential signal FE_OUTP 226a, FE_OUTN 226b of FIG. 2. The switched capacitor notch filter integrator 450 includes a plurality of switches CP1, CP2, CP3, CP4, CKR and a plurality of sampling capacitors $456a_1$, $456a_2$, $456a_3$, $456a_4$, $456b_1$, $456b_2$, $456b_3$, $456b_4$ (referred to generally as sampling capacitors 456) all coupled as shown, and coupled to input nodes of an amplifier 462, as may be implemented in the form of an emitter follower in some embodiments. The amplifier 462 is configured to generate a differential output signal 462a, 462b.

Some of the plurality of switches are controlled by a so-called "redistribution" clock signal, CKR. Other ones of the plurality of switches are controlled by a sample clock signals, CP1, CP2, CP3, CP4. Each one of the sample clock signals has the same frequency but occurs a different phase as described more fully below in conjunction with FIG. 4A.

A feedback capacitor 458 is coupled between an input node of the amplifier 462 and the output signal 462a. A feedback capacitor 160 is coupled between another input node of the amplifier 462 and the output signal 462b.

Figure 4A:
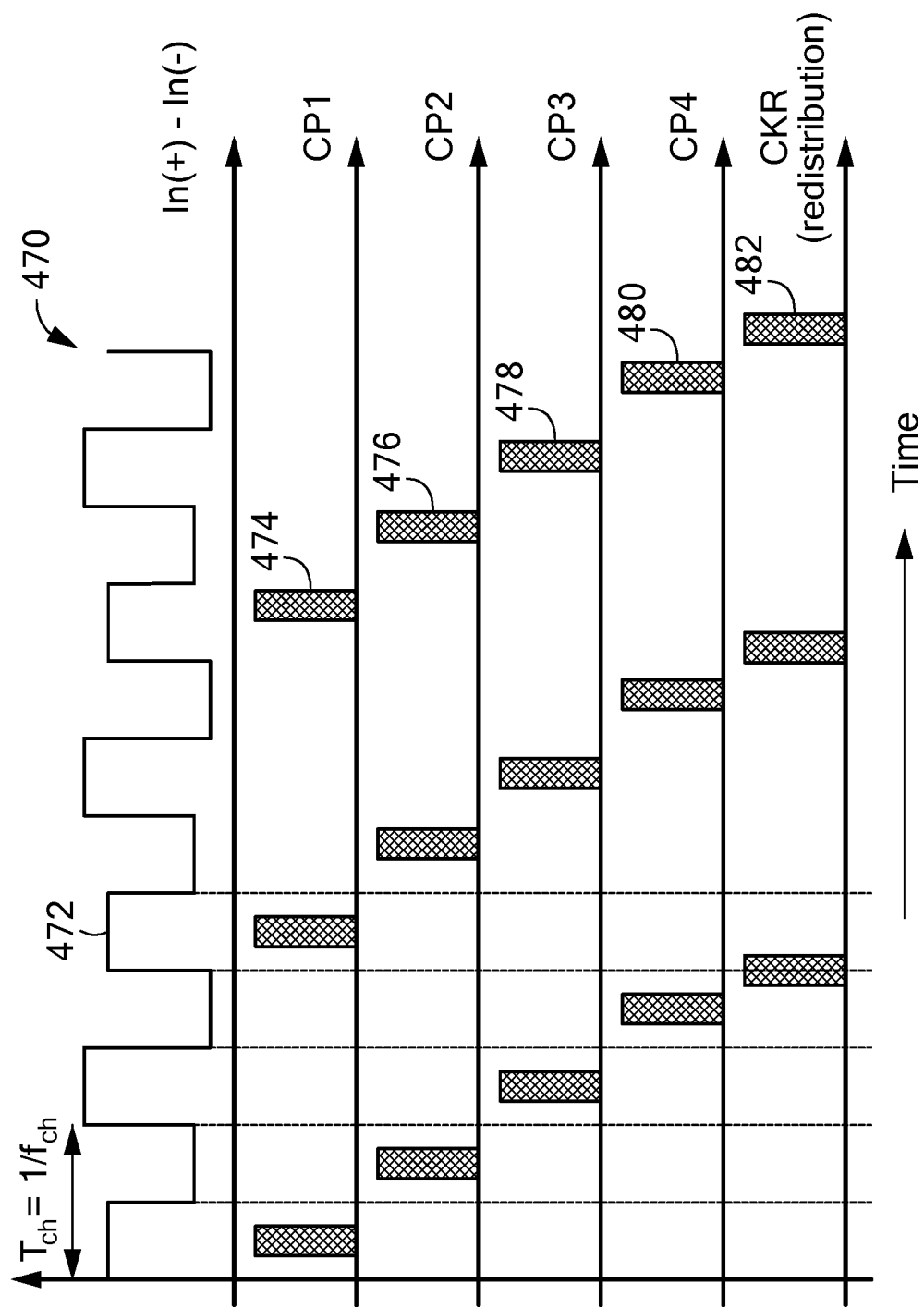
FIG. 4A illustrates example switch controls signals for the switched capacitor notch filter of FIG. 4.

Referring also to FIG. 4A, a graph 470 has a horizontal axis with a scale in units of time in arbitrary units and a vertical axis with a scale in units of volts in arbitrary units. A signal 472 can be the same as or similar to the differential input signal 452a, 452b of FIG. 4.

Clock signals 474, 476, 478, 480 can be the same as or similar to the sampling clock signals, CP1, CP2, CP3, CP4 of FIG. 4. The clock signals 474, 476, 478, 480 are shown as pluralities of dark boxes representing sampling periods, however, the dark boxes are representative of switch closures of respective ones of the pairs of switches in FIG. 4. In operation, at times when the sampling clock signals are high, the respective capacitor is coupled to the filter input signal 452a, 452b for charging (i.e., sampling).

A clock signal 482 can be referred to as a redistribution or averaging clock signal. The clock signal 482 is shown as a plurality of dark boxes, however, the dark boxes are representative of switch closures of respective ones of the switches in FIG. 4. In operation, at times when the redistribution clock signal 482 is high, samples associated with each one of the sample clock signals 474, 476, 478, 480 are averaged.

It will be appreciated that switched capacitor notch filter 450 is one of many example filters suitable for use with the present disclosure. Additional filter configurations and details can be found in U.S. Pat. No. 8,416,014, entitled "Switched Capacitor Notch Filter with Fast Response Time", issued on Apr. 9, 2013 and in co-pending U.S. patent application Ser. No. 16/372,603, entitled Fast Response Magnetic Field Sensors And Associated Methods For Removing Undesirable Spectral Components, and filed Apr. 2, 2019, which applications are incorporated herein by reference in its entirety.

It will also be appreciated that while the circuits and techniques are shown and described herein in connection with analog circuitry, alternatively digital circuitry and techniques can be used for some or all of the circuit functions, such as filtering and step detection as examples.

Figure 5:
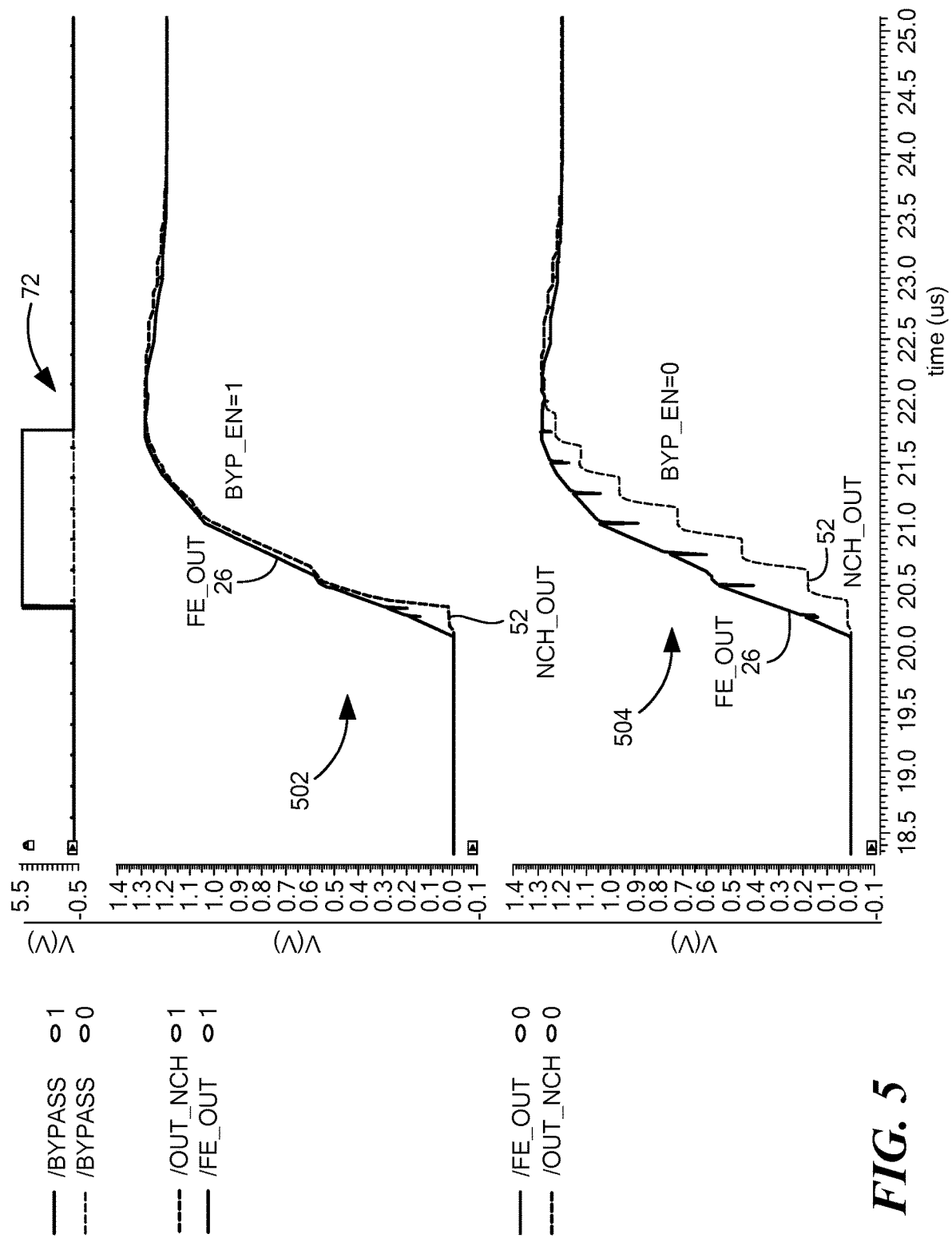
FIG. 5 includes a graph showing the delay through a conventional notch filter without the dynamic bypass feature of the disclosure and a graph showing the delay through the notch filter of FIG. 1 with the dynamic bypass feature of the disclosure.

Referring to FIG. 5, waveforms 502 include the front end output signal (i.e., filter input signal) FE_OUT 26 and the filter output signal NCH_OUT 52 and illustrate operation of the filter circuit 40 (FIG. 1) when the bypass signal 72 is enabled. Waveforms 504 also include the front end output signal (i.e., filter input signal) FE_OUT 26 and the filter output signal NCH_OUT 52 and illustrate operation of the filter circuit 40 when the bypass signal is released or disabled. As can be seen, when the bypass signal is asserted, there is very little delay between the filter input signal 26 and the filter output signal 52. During this operating condition, the filter capacitor 54 (FIG. 1) is quickly charged to the actual value of the input signal 26. When the bypass signal is disabled, the notch filter continues its normal operation of averaging the input signal starting from the newly settled value reached at the falling edge of the bypass signal. As can be seen from waveforms 504, under this condition, there is more delay between the filter input signal 26 and the filter output signal 52 as occurs due to the filtering action.

Figure 6:
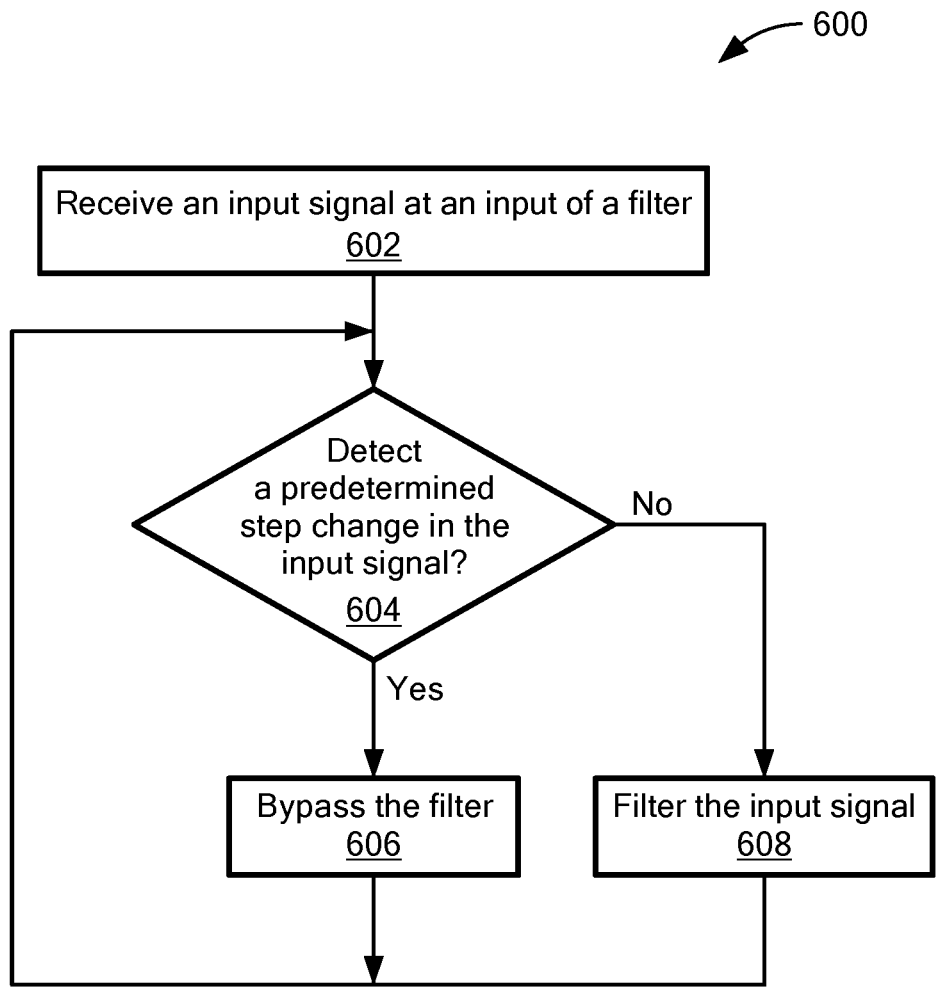
FIG. 6 is a flow diagram illustrating a process for reducing delay in a notch filter according to the disclosure.

Referring to FIG. 6, a method for reducing filter throughput delay in the presence of a large input signal step is shown. At block 602, an input signal is received at an input of a filter (e.g., input signal FE_OUT 26 is received at the input of filter 44 in FIG. 1).

At block 604, it is determined whether a predetermined step change has occurred in the input signal. This determination may be implemented in various ways, such as by using the step detector 200 of FIG. 2 or step detector 300 of FIG. 3.

If the predetermined input signal step change is detected in block 604, then in block 606, the filter is bypassed (i.e., the bypass signal is asserted). As explained, assertion of the bypass signal (e.g., signal 72 in FIG. 1) causes the input of the filter to be coupled to the output of the filter without filtering and quickly charging the filter capacitor (e.g., capacitor 54 in FIG. 1) to the level of the input signal 26.

If the predetermined input signal step change is not detected in block 604, then the input signal is filtered by the filter starting from the newly settled value reached at the falling edge of the bypass signal at block 608.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

All references cited herein are hereby incorporated herein by reference in their entirety.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments, it will now become apparent to one of ordinary skill in the art that other embodiments incorporating their concepts may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A filter circuit, comprising:
a filter having an input and an output at which an output of the filter is provided;
a step detector coupled to receive an input signal at the input of the filter and configured to detect a predetermined step in the input signal and to assert a bypass signal in response to detection of the predetermined step; and
a logic circuit responsive to the bypass signal and configured to cause the input signal to be coupled to the output of the filter without filtering when the bypass signal is asserted.

2. The filter circuit of claim 1, wherein the filter comprises:
an amplifier having at least one input and an output at which the output of the filter is provided; and
a sampling capacitor selectively coupled to (a) the input of the filter through a first switch, (b) the at least one input of the amplifier through a second switch, or (c) to both the input of the filter through the first switch and to the at least one input of the amplifier through the second switch.

3. The filter circuit of claim 2, wherein the logic circuit is configured to cause the sampling capacitor to be coupled to both the input of the filter through the first switch and to the at least one input of the amplifier when the bypass signal is asserted.

4. The filter circuit of claim 2, wherein the sampling capacitor comprises a plurality of parallel coupled sampling capacitors, each selectively coupled to (a) the input of the filter through a respective first switch, (b) the at least one input of the amplifier through a respective second switch, or (c) to both the input of the filter through the respective first switch and to the at least one input of the amplifier through the respective second switch.

5. The filter circuit of claim 2, wherein the amplifier has at least two inputs, the input signal is a differential input signal, and the amplifier comprises two inputs coupled to receive the differential input signal.

6. The filter circuit of claim 1, wherein the predetermined step in the input signal is detected when a change in the input signal is greater than a predetermined threshold.

7. The filter circuit of claim 6, wherein the step detector comprises a comparator having a first input coupled to receive the input signal, a second input coupled to receive the predetermined threshold, and an output at which the bypass signal is provided based on evaluation of a derivative of the input signal.

8. The filter circuit of claim 6, wherein the step detector comprises a comparator having a first input coupled to receive an offset version of the input signal that differs from the input signal by an offset amount, a second input coupled to receive the output of the filter, and an output at which the bypass signal is provided, wherein the offset amount corresponds to the predetermined threshold.

9. The filter circuit of claim 1, wherein the filter is an analog filter.

10. The filter circuit of claim 1, wherein the filter is a digital filter.

11. The filter circuit of claim 1, wherein the filter is a notch filter.

12. A magnetic field sensor comprising:
one or more magnetic field sensing elements configured to generate a magnetic field signal in response to a magnetic field;
a front end amplifier coupled to the one or more magnetic field sensing elements and configured to amplify the magnetic field signal to generate a front end output signal;
a filter circuit comprising:
  a filter having an input coupled to receive the front end output signal and an output at which a filter output signal is provided;
  a step detector coupled to receive the front end output signal and configured to detect a predetermined step in the input signal and to assert a bypass signal in response to detection of the predetermined step; and
  a logic circuit responsive to the bypass signal and configured to cause the front end output signal to be coupled to the output of the filter without filtering when the bypass signal is asserted; and
an output circuit coupled to receive the filter output signal and having an output at which a sensor output signal is provided in response to the filter output signal.

13. The magnetic field sensor of claim 12, wherein the filter comprises:
an amplifier having at least one input and an output at which the filter output signal is provided; and
a sampling capacitor selectively coupled to (a) the input of the filter through a first switch, (b) the at least one input of the amplifier through a second switch, or (c) to both the input of the filter through the first switch and to the at least one input of the amplifier through the second switch.

14. The magnetic field sensor of claim 13, wherein the logic circuit is configured to cause the sampling capacitor to be coupled to both the input of the filter through the first switch and to the at least one input of the amplifier when the bypass signal is asserted.

15. The magnetic field sensor of claim 12, wherein the front end amplifier is a chopped amplifier operating a chopping frequency and wherein the filter has a notch selected to attenuate signal components at the chopping frequency.

16. The magnetic field sensor of claim 12, wherein output circuit comprises a fault detector configured to generate a fault signal in response to detection of a fault.

17. A method comprising:
receiving an input signal at an input of a filter;
monitoring the input signal to detect a predetermined step change; and
selectively filtering, by the filter, the input signal to generate a filter output signal when the predetermined step change in the input signal is not detected or bypassing the filter when the predetermined step change in the input signal is detected, wherein filtering comprises selectively coupling at least one sampling capacitor either to the input of the filter through a first switch or to an input of an amplifier through a second switch.

18. The method of claim 17, wherein bypassing the filter comprises charging the at least one sampling capacitor to a level of the input signal.

19. The method of claim 17, wherein monitoring the input signal comprises comparing the input signal to a predetermined threshold.

20. The method of claim 17, wherein monitoring the input signal comprises comparing the filter output signal to an offset version of the input signal.

21. Apparatus comprising:
a filter having an input and an output at which an output of the filter is provided;
means, coupled to receive an input signal at the input of the filter, for detecting a predetermined step in the input signal and to assert a bypass signal in response to detection of the predetermined step; and
means, responsive to the bypass signal, for coupling the input signal to the output of the filter without filtering when the bypass signal is asserted.

22. The apparatus of claim 21, wherein the filter comprises:
an amplifier having at least one input and an output at which the output of the filter is provided; and
a sampling capacitor selectively coupled to (a) the input of the filter through a first switch, (b) the at least one input of the amplifier through a second switch, or (c) to both the input of the filter through the first switch and to the at least one input of the amplifier through the second switch.

23. The apparatus of claim 21, wherein the detecting means comprises means for detecting when a change in the input signal is greater than a predetermined threshold.

* * * * *